(12) United States Patent
Kanzaki et al.

(10) Patent No.: US 10,012,883 B2
(45) Date of Patent: Jul. 3, 2018

(54) SEMICONDUCTOR DEVICE INCLUDING A SILICON NITRIDE DIELECTRIC LAYER AND METHOD FOR PRODUCING SAME

(71) Applicant: Sharp Kabushiki Kaisha, Sakai-shi, Osaka (JP)

(72) Inventors: Yohsuke Kanzaki, Sakai (JP); Seiji Kaneko, Sakai (JP); Takao Saitoh, Sakai (JP); Yutaka Takamaru, Sakai (JP); Keisuke Ide, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/117,524

(22) PCT Filed: Feb. 2, 2015

(86) PCT No.: PCT/JP2015/052827
§ 371 (c)(1),
(2) Date: Aug. 9, 2016

(87) PCT Pub. No.: WO2015/119073
PCT Pub. Date: Aug. 13, 2015

(65) Prior Publication Data
US 2016/0349556 A1    Dec. 1, 2016

(30) Foreign Application Priority Data

Feb. 10, 2014 (JP) .................................. 2014-023697

(51) Int. Cl.
*H01L 21/318* (2006.01)
*G02F 1/1368* (2006.01)
(Continued)

(52) U.S. Cl.
CPC ...... *G02F 1/1368* (2013.01); *G02F 1/133345* (2013.01); *G02F 1/136213* (2013.01);
(Continued)

(58) Field of Classification Search
None
See application file for complete search history.

(56) References Cited

U.S. PATENT DOCUMENTS 6,207,586 B1 * 3/2001 Ma ........................ C23C 16/345
257/E21.269
6,284,583 B1 * 9/2001 Saida .................. C23C 16/0218
257/E21.293
(Continued)

FOREIGN PATENT DOCUMENTS

JP          09-171196 A      6/1997
JP          2010-230744 A    10/2010
(Continued)

OTHER PUBLICATIONS

Official Communication issued in International Patent Application No. PCT/JP2015/052827, dated Mar. 31, 2015.

*Primary Examiner* — Eric Ward
(74) *Attorney, Agent, or Firm* — Keating & Bennett, LLP

(57) ABSTRACT

A semiconductor device (100A) includes a substrate (11); a TFT (10A) supported on the substrate, the TFT including an oxide semiconductor layer (16); an organic insulating layer (24) covering the TFT; a lower layer electrode (32) on the organic insulating layer; a dielectric layer (34) on the lower layer electrode; an upper layer electrode on the dielectric layer; and an upper layer electrode (36) including a portion opposing the lower layer electrode via the dielectric layer. The dielectric layer is a silicon nitride film having a hydrogen content of $5.33 \times 10^{21}$ atoms/cm$^3$ or less.

2 Claims, 7 Drawing Sheets

(51) Int. Cl.
    *H01L 21/02*     (2006.01)
    *G02F 1/1362*     (2006.01)
    *H01L 29/66*     (2006.01)
    *H01L 29/786*     (2006.01)
    *H01L 27/12*     (2006.01)
    *G02F 1/1333*     (2006.01)
    *H01L 29/24*     (2006.01)
    *G02F 1/1343*     (2006.01)

(52) U.S. Cl.
    CPC .... *G02F 1/136227* (2013.01); *H01L 21/0217* (2013.01); *H01L 21/02211* (2013.01); *H01L 21/02274* (2013.01); *H01L 27/124* (2013.01); *H01L 27/1225* (2013.01); *H01L 27/1248* (2013.01); *H01L 27/1255* (2013.01); *H01L 27/1262* (2013.01); *H01L 29/24* (2013.01); *H01L 29/66969* (2013.01); *H01L 29/7869* (2013.01); *H01L 29/78606* (2013.01); *H01L 29/78696* (2013.01); *G02F 2001/134372* (2013.01)

(56) References Cited

U.S. PATENT DOCUMENTS

| | | | |
|---|---|---|---|
| 6,413,887 B1* | 7/2002 | Fukuda | C23C 16/308 257/E21.293 |
| 6,933,245 B2* | 8/2005 | Lee | C23C 16/4554 257/E21.293 |
| 9,640,557 B2* | 5/2017 | Oda | H01L 27/124 |
| 2002/0041031 A1* | 4/2002 | Sato | H01L 21/3185 257/758 |
| 2004/0099915 A1 | 5/2004 | Takayama et al. | |
| 2006/0225657 A1* | 10/2006 | Mizushima | C23C 16/345 118/724 |
| 2009/0098741 A1* | 4/2009 | Tanaka | C23C 16/34 438/791 |
| 2011/0227060 A1* | 9/2011 | Miyanaga | H01L 29/7869 257/43 |
| 2011/0318940 A1* | 12/2011 | Ota | C23C 16/34 438/776 |
| 2012/0138922 A1 | 6/2012 | Yamazaki et al. | |
| 2012/0153442 A1* | 6/2012 | Honda | C23C 16/345 257/649 |
| 2013/0337660 A1* | 12/2013 | Ota | C23C 16/308 438/786 |
| 2014/0346502 A1 | 11/2014 | Matsukizono | |

FOREIGN PATENT DOCUMENTS

| | | |
|---|---|---|
| JP | 2012-134475 A | 7/2012 |
| JP | 2013-239759 A | 11/2013 |
| JP | 2014-022615 A | 2/2014 |
| WO | 2013/084846 A1 | 6/2013 |

\* cited by examiner (a)

(b)

(a)

(b)

(c)

(d)

(e)

(a)

(b)

(a)

(b)

SEMICONDUCTOR DEVICE INCLUDING A SILICON NITRIDE DIELECTRIC LAYER AND METHOD FOR PRODUCING SAME

TECHNICAL FIELD

The present invention relates to a semiconductor device and a production method of the same, and more particularly to a semiconductor device including an oxide semiconductor TFT, and a production method of the same.

BACKGROUND ART

In recent years, liquid crystal display devices of the active matrix type have widely been used. Active matrix type liquid crystal display devices include an active matrix substrate (also referred to as a "TFT substrate") having a thin film transistor (TFT) provided for each pixel, a counter substrate opposing the active matrix substrate, and a liquid crystal layer interposed therebetween. By controlling a voltage that is applied to the liquid crystal layer (which is referred to as a "liquid crystal capacitor" in electrical terms) in each pixel via the TFT, an active matrix type liquid crystal display device adjusts the amount of light transmitted through the pixel, thus performing displaying. In each pixel of the TFT substrate, a storage capacitor is provided which is connected electrically in parallel to the liquid crystal capacitor.

Patent Document 1 proposes a structure for improving the aperture ratio of an active matrix type liquid crystal display device. In the structure proposed in Patent Document 1, an organic insulating layer is formed so as to cover the TFT, and on this organic insulating layer, a storage capacitor electrode, a dielectric layer, and a pixel electrode are stacked in this order (or in reverse order), whereby a storage capacitor is formed.

On the other hand, oxide semiconductors have recently been drawing attention as materials for a TFT active layer. Patent Document 2 discloses, as Variant 2, an active matrix type liquid crystal display device incorporating TFTs as switching elements, of which active layers are oxide semiconductor films. An oxide semiconductor has a higher mobility than does an amorphous silicon, and is able to operate more rapidly than a TFT whose active layer is an amorphous silicon film (hereinafter, an "amorphous silicon TFT"). In the present specification, a TFT whose active layer is an oxide semiconductor film may be referred to as an "oxide semiconductor TFT".

CITATION LIST

Patent Literature

[Patent Document 1] Japanese Laid-Open Patent Publication No. 9-171196

[Patent Document 2] Japanese Laid-Open Patent Publication No. 2010-230744

SUMMARY OF INVENTION

Technical Problem

In an active matrix type liquid crystal display device including oxide semiconductor TFTs, the inventors have tried a construction where storage capacitors are formed on an organic insulating layer covering the oxide semiconductor TFTs; as a result, a problem has been found in that air voids may occur in the liquid crystal layer during a preservation test under high temperature and high humidity. Such air voids will be a cause of deteriorated display quality, and may degrade the reliability of the liquid crystal display device.

The present invention has been made in view of the above problems, and an objective thereof is to improve the reliability of a semiconductor device including oxide semiconductor TFTs, under high temperature and high humidity.

Solution to Problem

A semiconductor device according to an embodiment of the present invention comprises: a substrate; a thin film transistor supported on the substrate, the thin film transistor including an oxide semiconductor layer; an organic insulating layer covering the thin film transistor; a lower layer electrode on the organic insulating layer; a dielectric layer on the lower layer electrode; and an upper layer electrode on the dielectric layer, the upper layer electrode including a portion opposing the lower layer electrode via the dielectric layer, wherein the dielectric layer is a silicon nitride film having a hydrogen content of $5.33 \times 10^{21}$ atoms/cm$^3$ or less.

In one embodiment, the silicon nitride film has a relative dielectric constant of 6.56 or less.

In one embodiment, the oxide semiconductor layer comprises an In—Ga—Zn—O type semiconductor.

In one embodiment, the In—Ga—Zn—O type semiconductor includes a crystalline portion.

In one embodiment, the oxide semiconductor layer comprises an In—Sn—Zn—O type semiconductor, an In—Ga—Sn—O type semiconductor, or an In—Ga—O type semiconductor.

In one embodiment, the upper layer electrode and the lower layer electrode are each made of a transparent electrically conductive material.

A production method of a semiconductor device according to an embodiment of the present invention comprises: step (a) of providing a substrate; step (b) of forming a thin film transistor on the substrate, the thin film transistor including an oxide semiconductor layer; step (c) of forming an organic insulating layer covering the thin film transistor; step (d) of forming a lower layer electrode on the organic insulating layer; step (e) of forming a dielectric layer on the lower layer electrode; and step (f) of forming an upper layer electrode on the dielectric layer, wherein, step (e) is a step of forming a silicon nitride film as the dielectric layer, and is performed under film formation conditions such that the silicon nitride film has a hydrogen content of $5.33 \times 10^{21}$ atoms/cm$^3$ or less.

In one embodiment, step (e) is performed under film formation conditions such that the silicon nitride film has a relative dielectric constant of 6.56 or less.

In one embodiment, step (e) is performed by a plasma CVD technique, using a gaseous mixture containing SiH$_4$ and also containing NH$_3$ and/or N$_2$, under film formation conditions defined by: an intra-chamber pressure of not less than 1200 mTorr and not more than 1500 mTorr; a substrate temperature of not less than 180° C. and not more than 220° C.; an inter-electrode distance of not less than 18 mm and not more than 25 mm; a ratio of the flow rate of SiH$_4$ to a total flow rate of the gaseous mixture being not less than 3% and not more than 5%; and a power density of 0.36 W/cm$^2$ or more.

In one embodiment, step (e) is performed with a power density of 0.49 W/cm$^2$ or less.

Advantageous Effects of Invention

According to an embodiment of the present invention, the reliability of a semiconductor device including oxide semiconductor TFTs under high temperature and high humidity can be improved.

DESCRIPTION OF EMBODIMENTS

First, findings which have been made by the inventors regarding occurrence of the aforementioned air voids will be explained.

Figure 8:
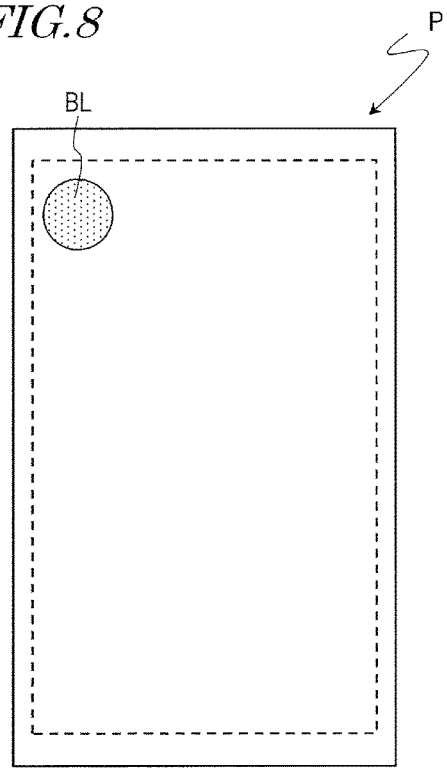
FIG. 8 A diagram schematically showing an air void BL occurring in a liquid crystal layer.

In an active matrix type liquid crystal display device including oxide semiconductor TFTs, the inventors tried a construction where storage capacitors were formed on an organic insulating layer covering the oxide semiconductor TFTs; this resulted in some instances of air voids occurring in the liquid crystal layer during a preservation test under high temperature and high humidity. FIG. 8 schematically shows an air void BL occurring in the liquid crystal display panel P. The air void BL has a size (diameter) of e.g. about 10 mm.

At the incipient stage of their occurrence, the air voids are too small to be visually recognized, but they gradually gather together to become larger over time. The amount of time until occurrence of air voids is observed will be shorter under conditions of higher vapor pressure. For example, under the conditions of 50° C.-95% RH, 60° C.-95% RH, and 70° C.-95% RH, the amount of time until air voids occur will become increasingly shorter in this order. The inventors have analyzed the components of the air voids, thus finding a main component (about 90% by volume ratio) of the air voids to be $H_2$ (hydrogen), and the remaining components to be $N_2$ (nitrogen), CO (carbon monoxide), and $CO_2$ (carbon dioxide).

Although the mechanism that causes air voids has not been completely revealed, it is presumable that the hydrogen contained in the air voids was contained in a silicon nitride film being formed as a dielectric layer composing each storage capacitor. Moreover, from the fact that air voids are present in a construction where storage capacitors are formed on an organic insulating layer, it is presumable that the organic insulating layer, located below the silicon nitride film, is significantly involved in the air void formation.

The present invention has been made based on the above findings attained by the inventors. Hereinafter, with reference to the drawings, a semiconductor device according to embodiments of the present invention and a production method of the same will be described; however, the present invention is not limited to the illustrated embodiments. A semiconductor device according to an embodiment of the present invention may be any of various substrates, various display devices, and various electronic devices that include oxide semiconductor TFTs. The following description will take TFT substrates for liquid crystal display devices (active matrix substrates) as examples. There is no particular limitation as to the display mode of the liquid crystal display device; herein, TFT substrates for use in liquid crystal display devices which perform displaying in an FFS (Fringe Field Switching) mode will be illustrated. In the following description, constituent elements having substantially identical functions may be denoted by common reference numerals, with their description being omitted.

Figure 1:
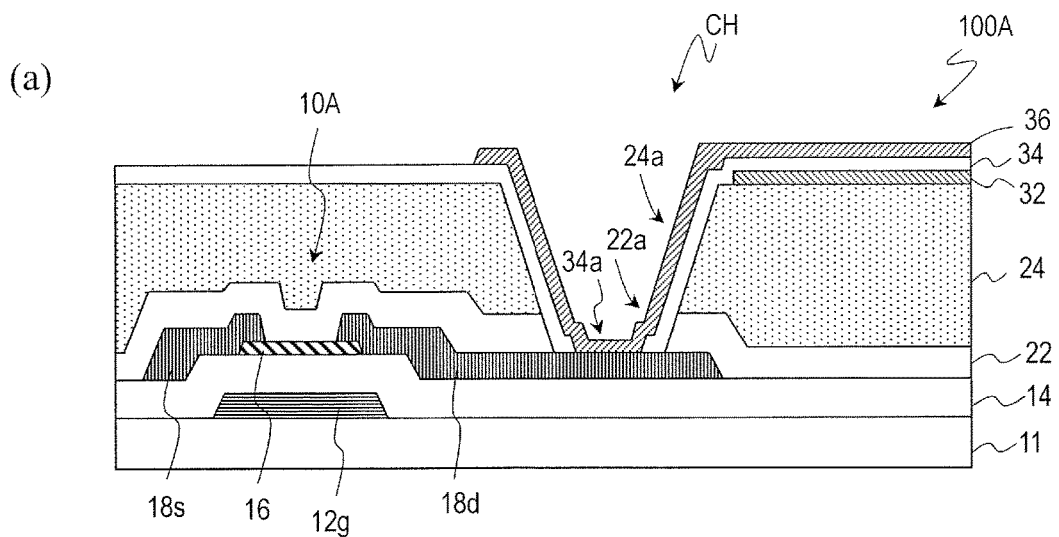
FIGS. 1 (a) and (b) are a schematic cross-sectional view and a plan view of a TFT substrate 100A according to an embodiment of the present invention, respectively.
Figure 1:
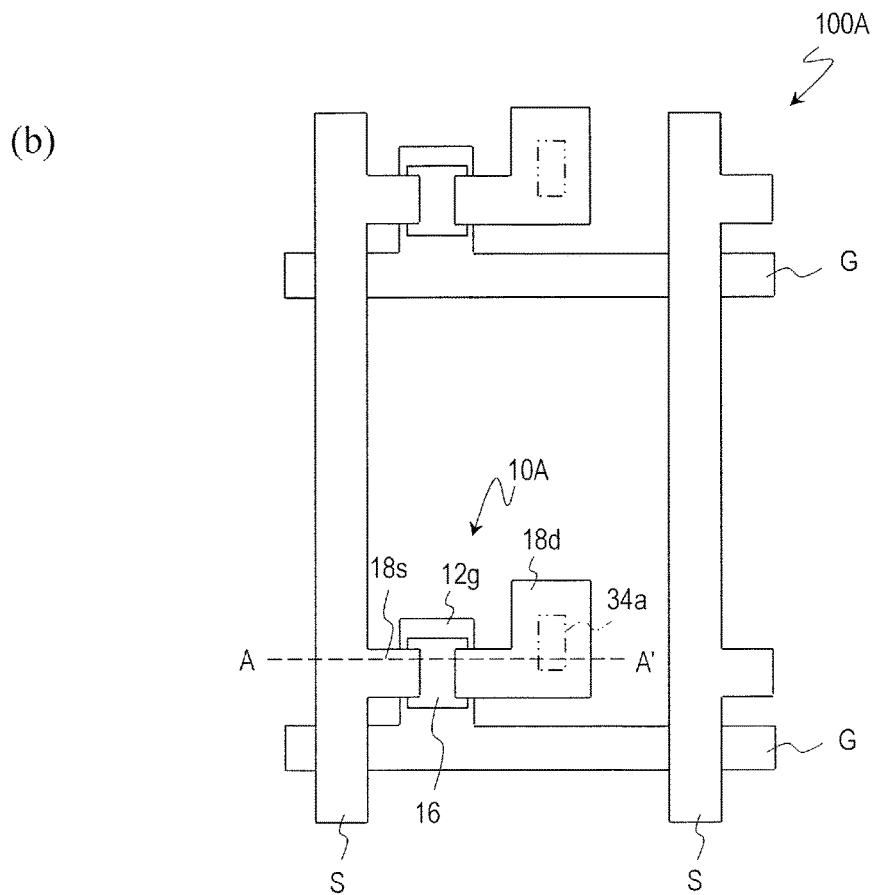

FIGS. 1(a) and (b) show a TFT substrate 100A according to an embodiment of the present invention. FIGS. 1(a) and (b) are a schematic cross-sectional view and a plan view of the TFT substrate 100A, respectively, where FIG. 1(a) corresponds to a cross section along line A-A' in FIG. 1(b) (i.e., a cross section containing a TFT 10A). In FIG. 1(b), some of the constituent elements shown in FIG. 1(a) (e.g., an upper layer electrode 36 to be described later, etc.) are omitted.

As shown in FIGS. 1(a) and (b), the TFT substrate 100A includes a substrate (which is typically a transparent substrate) 11 and a thin film transistor (TFT) 10A that is supported on the substrate 11. The TFT 10A includes a gate electrode 12g, a gate insulating film 14, an oxide semiconductor layer 16, a source electrode 18s, and a drain electrode 18d. In other words, the TFT 10A is an oxide semiconductor TFT.

The gate electrode 12g is electrically connected to a scanning line (gate bus line) G (in the present embodiment, it branches out from the scanning line G), and receives a scanning signal supplied from the scanning line G. The gate insulating film 14 is formed so as to cover the gate electrode 12g. The oxide semiconductor layer 16 is island-shaped, being formed so as to overlap the gate electrode 12g via the gate insulating film 14.

The source electrode 18s is electrically connected to a signal line (source bus line) S (in the present embodiment, it branches out from the signal line S), and receives a displaying signal supplied from the signal line S. The source electrode 18s is provided in contact with a portion (called a source region) of the oxide semiconductor layer 16. On the other hand, the drain electrode 18d is provided in contact with another portion (called a drain region) of the oxide semiconductor layer 16. A region of the oxide semiconductor layer 16 that is located between the source region and the drain region is called a channel region. A protection layer 22 is formed so as to cover the TFT 10A having the above-described construction.

The TFT 100A in the present embodiment further includes an organic insulating layer 24, a lower layer electrode 32, a dielectric layer 34, and an upper layer electrode 36.

The organic insulating layer 24 is provided on the protection layer 22 so as to cover the TFT 10A. The organic insulating layer 24 is typically made of a photo-sensitive resin material. The organic insulating layer 24 has a thickness of e.g. 1 μm to 3 μm.

The lower layer electrode 32 is provided on the organic insulating layer 24. Herein, the lower layer electrode 32 is formed so as to continuously extend over all pixels of the liquid crystal display device. However, the lower layer electrode 32 is not formed near a contact hole CH, which is for electrically connecting the drain electrode 18d of the TFT 10A and the upper layer electrode 36, as will be described later. With a common signal (COM signal) being supplied thereto, the lower layer electrode 32 functions as a common electrode.

The dielectric layer 34 is provided on the lower layer electrode 32. The dielectric layer 34 is a silicon nitride film, as will be described later. The dielectric layer 34 has a thickness of e.g. 50 nm to 200 nm.

The upper layer electrode 36 is provided on the dielectric layer 34. The upper layer electrode 36 has a portion which opposes the lower layer electrode 32 via the dielectric layer 34. An independent (separate) upper layer electrode 36 is formed for each pixel of the liquid crystal display device; although not shown, the upper layer electrode 36 has at least one slit. The upper layer electrode 36 is electrically connected to the drain electrode 18d of the TFT 10A within the contact hole CH, and functions as a pixel electrode.

Herein, each of the upper layer electrode 36 and the lower layer electrode 32 is a transparent electrode that is made of a transparent electrically conductive material. In other words, within the pixel, a transparent storage capacitor is created by the upper layer electrode 36 and the lower layer electrode 32 as well as the dielectric layer 34 interposed therebetween. The ratio of an area which the transparent storage capacitor occupies within the pixel is typically 50% to 80%.

Note that, although not shown, an alignment film is formed on the upper layer electrode 36. In the liquid crystal display device, a counter substrate is disposed opposite from the TFT substrate 100A, and a liquid crystal layer is provided between the TFT substrate 100A and the counter substrate.

In the TFT substrate 100A of the present embodiment, the dielectric layer 34 is a silicon nitride film with a relatively low hydrogen content, i.e., it is relatively dense in texture. Specifically, the dielectric layer 34 is a silicon nitride film with a hydrogen content of $5.33 \times 10^{21}$ atoms/cm$^3$ or less, thereby suppressing air void formation in the liquid crystal layer, as will be specifically described later with reference to study results. Thus, the reliability under high temperature and high humidity can be improved.

Figure 9:
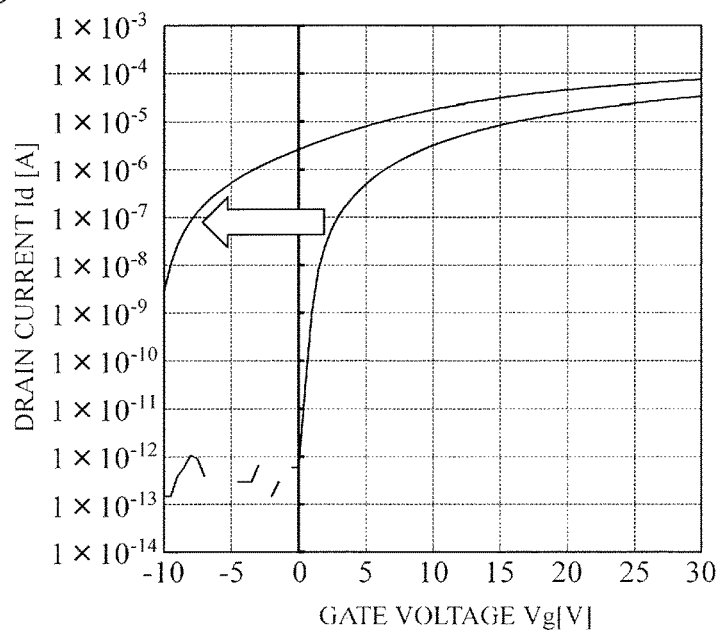
FIG. 9 A graph showing exemplary Id-Vg characteristics of a TFT which has been deteriorated (i.e., whose threshold voltage has had a negative shift).

However, it has been found through a study by the inventors that, if a silicon nitride film which is dense in texture is formed as a dielectric layer in a TFT substrate including oxide semiconductor TFTs, desired TFT characteristics may not be obtained in some cases. Specifically, as shown in FIG. 9, the threshold voltage will have a negative shift, whereby the TFT becomes a normally-ON device, thus hindering the operation of circuits that are internalized in the liquid crystal display device (e.g., a shift register circuit to be used as a gate driver).

Upon further studies the inventors have found that, by forming the silicon nitride film so as not to have an excessively high relative dielectric constant, deteriorations in the characteristics of the oxide semiconductor TFT can be suppressed. Specifically, from the standpoint of suppressing deteriorations in the characteristics of the TFT 10A as an oxide semiconductor TFT, it is preferable that the silicon nitride film (dielectric layer 34) has a relative dielectric constant of 6.56 or less. By ensuring that the silicon nitride film has a hydrogen content of $5.33 \times 10^{21}$ atoms/cm$^3$ or less and a relative dielectric constant of 6.56 or less, air void formation in the liquid crystal layer can be suppressed while also suppressing deteriorations in the characteristics of the TFT 10A.

Figure 2:
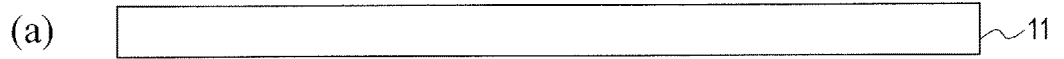
FIG. 2 (a) to (e) are step-by-step cross-sectional views schematically showing production steps for the TFT substrate 100A.
Figure 2:
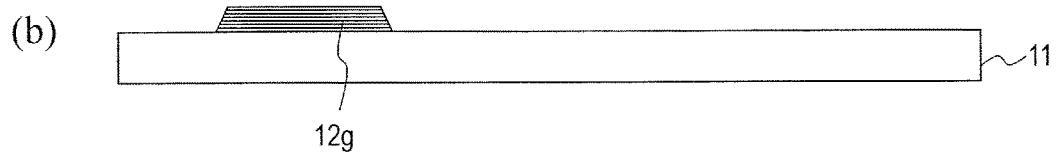
Figure 2:
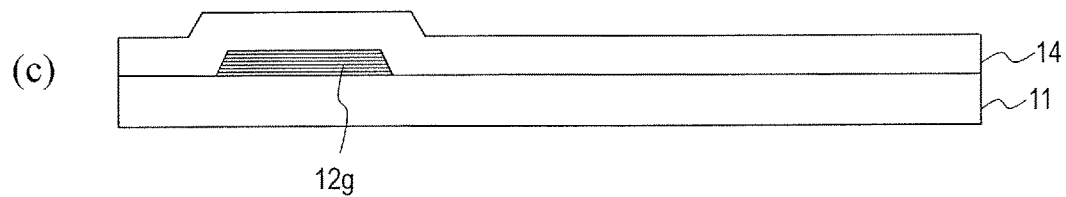
Figure 2:
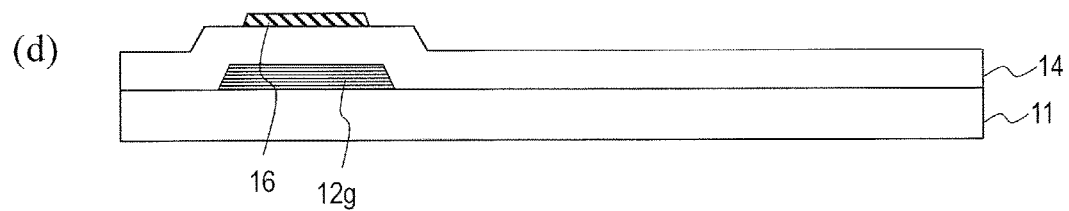
Figure 2:
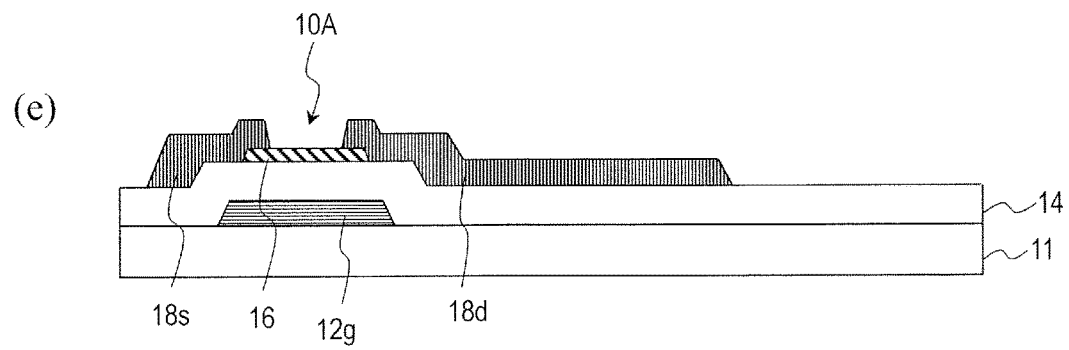
Figure 3:
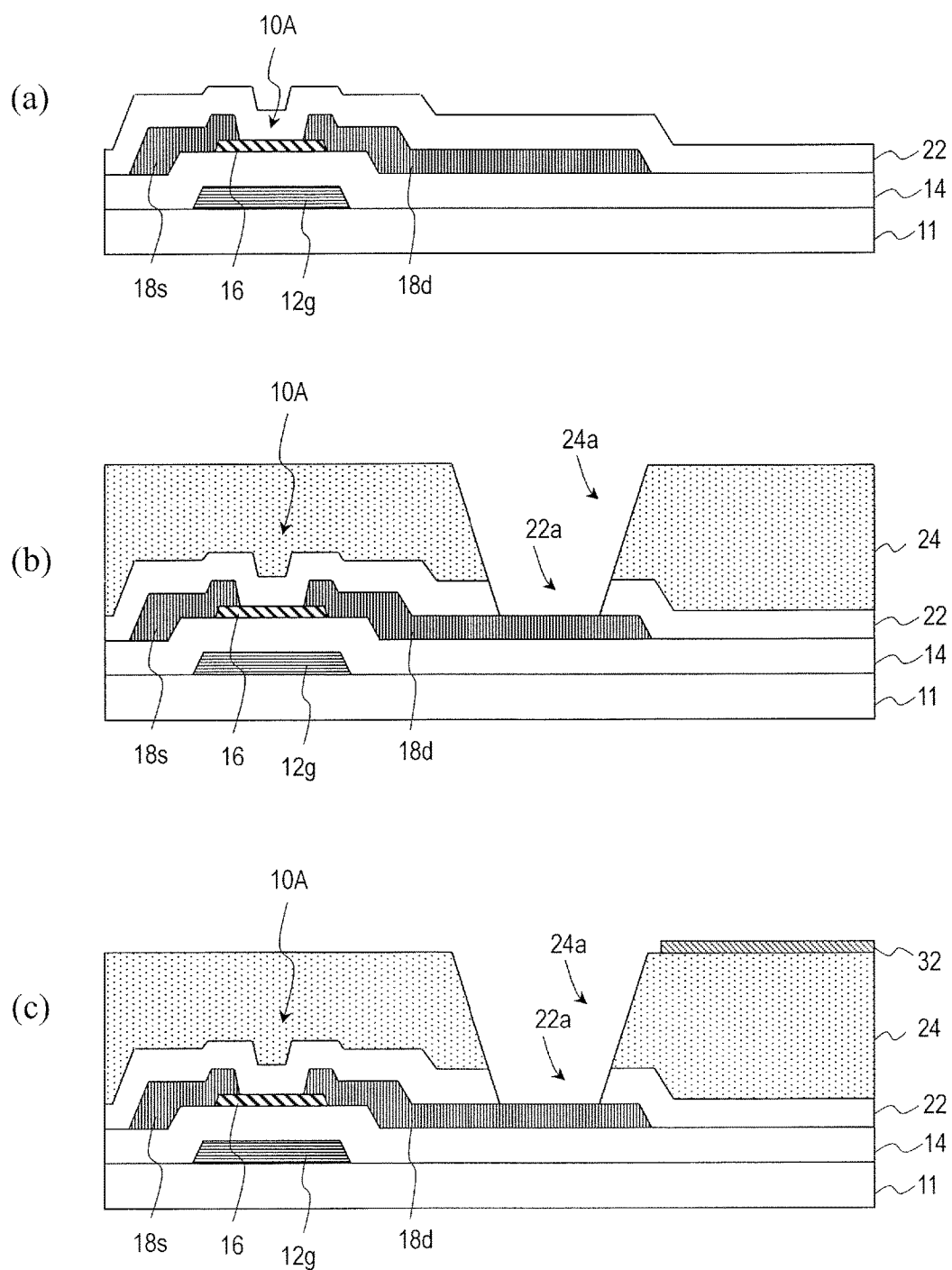
FIG. 3 (a) to (c) are step-by-step cross-sectional views schematically showing production steps for the TFT substrate 100A.
Figure 4:
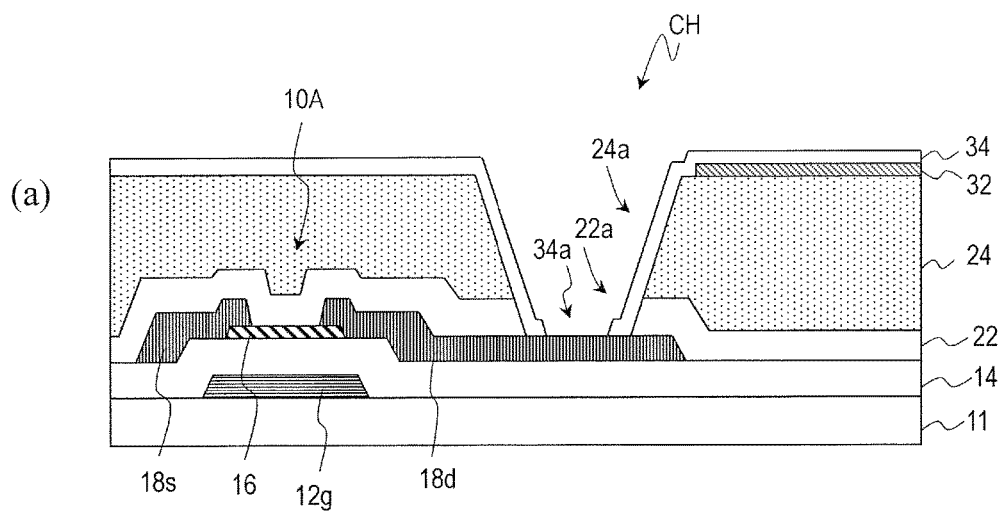
FIGS. 4 (a) and (b) are step-by-step cross-sectional views schematically showing production steps for the TFT substrate 100A.
Figure 4:
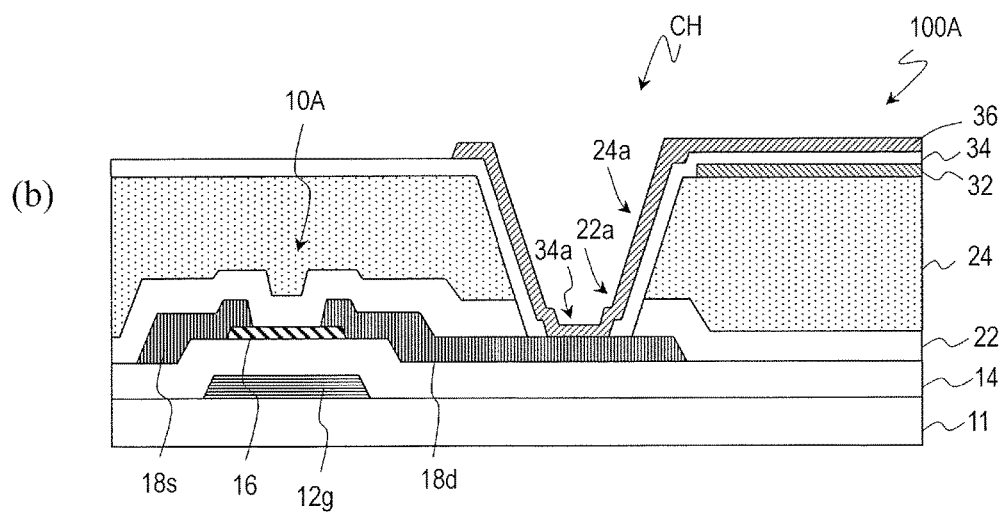

Next, with reference to FIG. 2, FIG. 3, and FIG. 4, a production method of the TFT substrate 100A according to the present embodiment will be described. FIGS. 2(a) to (e), FIGS. 3(a) to (c), and FIGS. 4(a) and (b) are step-by-step cross-sectional views schematically showing production steps for the TFT substrate 100A.

First, as shown in FIG. 2(a), a substrate 11 is provided. A glass substrate, a plastic substrate which is thermally resistant, or the like can be used as the substrate 11. Herein, a glass substrate is used.

Next, a TFT 10A including an oxide semiconductor layer 16 is formed on the substrate 11.

Specifically, first, as shown in FIG. 2(b), an electrically conductive film (hereinafter referred to as a "gate metal film") is deposited on the substrate 11 by a sputtering technique or the like, and thereafter the gate metal film is patterned by using a photolithography process, thereby forming a gate electrode 12g and a scanning line G (which is not shown in FIG. 2(b)). Herein, a tantalum nitride film (TaN film) having a thickness of 20 nm and a tungsten film (W film) having a thickness of 300 nm are sequentially deposited, and the resultant multilayer film is patterned to form the gate electrode 12g and the scanning line G.

Next, as shown in FIG. 2(c), by a CVD (Chemical Vapor Deposition) technique or the like, a gate insulating film 14 covering the gate electrode 12g and the gate bus line G is formed. Herein, a silicon nitride film (SiN$_x$ film) having a thickness of 300 nm and a silicon oxide film (SiO$_2$ film) having a thickness of 50 nm are sequentially deposited to form the gate insulating film 14.

Then, as shown in FIG. 2(d), an oxide semiconductor film is deposited on the gate insulating film 14 by a sputtering technique, a CVD technique, or the like, and thereafter the oxide semiconductor film is patterned by using a photolithography process, thereby forming an island-shaped oxide semiconductor layer 16. Herein, after a film of a semiconductor of an In—Ga—Zn—O-type (hereinafter abbreviated as "In—Ga—Zn—O type semiconductor") having a thickness of 50 nm is deposited by a sputtering technique, the entire substrate is subjected to a heat treatment (e.g., not less than 300° C. and not more than 500° C.; about 1 to 2 hours). Performing the heat treatment allows oxygen defects in the oxide semiconductor to be restored. Thereafter, the In—Ga—Zn—O-type semiconductor film is patterned by using a photolithography process, thereby forming an island-shaped oxide semiconductor layer 16.

Thus, the oxide semiconductor layer 16 contains an In—Ga—Zn—O type semiconductor, for example. Herein, the In—Ga—Zn—O type semiconductor is a ternary oxide of In (indium), Ga (gallium), and Zn (zinc), with no particular limitation as to the ratio (composition ratio) of In, Ga and Zn, including In:Ga:Zn=2:2:1, In:Ga:Zn=1:1:1, In:Ga:Zn=1:1:2, and the like, for example. In the present embodiment, the oxide semiconductor layer 16 may be an In—Ga—Zn—O type semiconductor layer containing In, Ga and Zn at a ratio of In:Ga:Zn=1:1:1, for example.

A TFT including an In—Ga—Zn—O type semiconductor layer has a high mobility (20 times that of an a-SiTFT or higher) and a low leakage current (less than 1/100 of that of a-SiTFT), and is suitably used as a driving TFT or a pixel TFT. By using a TFT including an In—Ga—Zn—O type semiconductor layer, it is possible to greatly reduce the power consumption of a display device.

The In—Ga—Zn—O type semiconductor may be amorphous, or contain a crystalline portion(s). As the crystalline In—Ga—Zn—O type semiconductor, a crystalline In—Ga—Zn—O type semiconductor whose c axis is aligned essentially perpendicular to the layer plane is preferable. The crystal structure of such an In—Ga—Zn—O type semiconductor is disclosed in Japanese Laid-Open Patent Publication No. 2012-134475, for example. The entire disclosure of Japanese Laid-Open Patent Publication No. 2012-134475 is incorporated herein by reference.

The oxide semiconductor layer 16 may contain any other oxide semiconductor instead of an In—Ga—Zn—O type semiconductor. For example, it may contain a Zn—O type semiconductor (ZnO), In—Zn—O type semiconductor (IZO (registered trademark)), a Zn—Ti—O type semiconductor (ZTO), a Cd—Ge—O type semiconductor, a Cd—Pb—O type semiconductor, CdO (cadmium oxide), an Mg—Zn—O type semiconductor, an In—Sn—Zn—O type semiconductor (e.g. $In_2O_3$—$SnO_2$—ZnO), an In—Ga—Sn—O type semiconductor, an In—Ga—O type semiconductor, or the like.

Next, as shown in FIG. 2(e), after an electrically conductive film (hereinafter referred to as a "source metal film") is deposited on the oxide semiconductor layer 16 by a sputtering technique or the like, the source metal film is patterned by using a photolithography process, thereby forming a source electrode 18s, a drain electrode 18d, and a signal line S (not shown in FIG. 2(e)). Herein, a titanium film (Ti film) having a thickness of 30 nm, an aluminum film (Al film) having a thickness of 300 nm, and a Ti film having a thickness of 100 nm are sequentially deposited, and the resultant multilayer film is patterned to form the source electrode 18s, the drain electrode 18d, and the source bus line S. In this manner, the TFT 10A including the oxide semiconductor layer 16 can be formed on the substrate 11.

Next, as shown in FIG. 3(a), a protection layer 22 is deposited on the TFT 10A by a CVD (Chemical Vapor Deposition) technique or the like. Herein, the protection layer 22 is formed by depositing a silicon dioxide film ($SiO_2$ film) having a thickness of 300 nm. Thereafter, the entire substrate is subjected to a heat treatment (e.g., not less than 250° C. and not more than 450° C.; about 1 to 2 hours). By performing the heat treatment, the contact resistance between the oxide semiconductor layer 16 and the source electrode 18s or drain electrode 18d can be reduced. Moreover, since the channel region of the oxide semiconductor layer 16 is oxidized, oxygen defects in the channel region can be reduced.

Then, as shown in FIG. 3(b), an organic insulating layer 24 is formed so as to cover the TFT 10A. The organic insulating layer 24 can be formed by, for example, applying a positive type photo-sensitive resin material (e.g., an acrylic resin material) onto the protection layer 22, and effecting exposure and development thereof. As the material of the organic insulating layer 24, a negative type photo-sensitive resin material may also be used. Herein, an organic insulating layer 24 having a thickness of 2.0 μm is formed by using an acrylic resin material. At this point, an opening 24a is formed at a position overlapping the drain electrode 18d. Thereafter, an etch is performed by using the organic insulating layer 24 as a mask, thereby forming the opening 22a in the protection layer 22, thus exposing a portion of the drain electrode 18d.

Next, as shown in FIG. 3(c), a lower layer electrode 32 is formed on the organic insulating layer 24. The lower layer electrode 32 can be formed by, after depositing a transparent conductive film on the organic insulating layer 24 by a sputtering technique or the like, patterning the transparent conductive film by using a photolithography process. As the material of the transparent conductive film, indium tin oxide (ITO), indium zinc oxide (IZO (registered trademark)), or the like can be used. Herein, a transparent conductive film which is obtained by depositing an IZO film having a thickness of 100 nm is patterned to form the lower layer electrode 32.

Next, as shown in FIG. 4(a), a dielectric layer 34 is formed on the lower layer electrode 32. In the present embodiment, a silicon nitride film is formed as the dielectric layer 34 by a plasma CVD technique. Formation of the silicon nitride film is to be performed under film formation conditions which will be described later. Herein, a silicon nitride film having a thickness of 100 nm is deposited. Thereafter, an opening 34a is formed in a portion (a region overlapping the opening 22a of the protection layer 22 and the opening 24a of the organic insulating layer 24) of the dielectric layer 34 via etching, thereby forming a contact hole CH through which the drain electrode 18d of the TFT 10A is to be electrically connected to the upper layer electrode 36.

Then, as shown in FIG. 4(b), an upper layer electrode 36 is formed on the dielectric layer 34. The upper layer electrode 36 can be formed in a similar manner to the lower layer electrode 32. Herein, an IZO film having a thickness of 100 nm is deposited, and the resultant transparent conductive film is patterned to form the upper layer electrode 36. The upper layer electrode 36 is electrically connected to the drain electrode 18d of the TFT 10A in the contact hole CH.

In this manner, the TFT substrate 100A shown in FIGS. 1(a) and (b) is obtained.

Now, the film formation conditions for the silicon nitride film at the step of forming the dielectric layer 34 will be described. In the present embodiment, the step of forming the silicon nitride film is to be performed under film formation conditions such that the silicon nitride film has a hydrogen content of $5.33 \times 10^{21}$ atoms/cm$^3$ or less. In the case of forming the silicon nitride film by a plasma CVD technique, a gaseous mixture of $SiH_4$ and $NH_3$, a gaseous mixture of $SiH_4$ and $N_2$, or a gaseous mixture of $SiH_4$, $NH_3$ and $N_2$ can be used as the source gas, for example. In other words, it is possible to use a gaseous mixture which contains $SiH_4$ and also contains $NH_3$ and/or $N_2$.

Example parameters of film formation conditions include intra-chamber pressure, substrate temperature, inter-electrode distance, a ratio of the flow rate of $SiH_4$ to the total flow rate of the gaseous mixture, and power density. Among these parameters, power density may be increased, for example, to make the silicon nitride film denser in texture (i.e., so as to have a higher relative dielectric constant), thereby reducing the hydrogen content.

In order to ensure that the hydrogen content in the silicon nitride film is $5.33 \times 10^{21}$ atoms/cm$^3$ or less, the step of forming the silicon nitride film is preferably performed under film formation conditions such that the silicon nitride film has a relative dielectric constant of 6.25 or more. Specifically, given an intra-chamber pressure of not less than 1200 mTorr and not more than 1500 mTorr, a substrate temperature of not less than 180° C. and not more than 220°

C., an inter-electrode distance of not less than 18 mm and not more than 25 mm, and a ratio of the flow rate of $SiH_4$ to a total flow rate of the gaseous mixture being not less than 3% and not more than 5%, it can be ensured by setting the power density to be 0.36 $W/cm^2$ or more that the hydrogen content in the silicon nitride film is $5.33 \times 10^{21}$ $atoms/cm^3$ or less.

If the power density is made too high, the characteristics of the TFT 10A being an oxide semiconductor TFT may be deteriorated (e.g., its threshold voltage may have a negative shift), or the organic insulating layer 24 may be discolored. In order to suppress these problems, it is preferable that the power density is 0.49 $W/cm^2$ or less. When the power density is 0.49 $W/cm^2$ or less, the relative dielectric constant of the silicon nitride film can be made 6.56 or less, whereby air void formation in the liquid crystal layer can be suppressed while also suppressing deteriorations in the characteristics of the TFT 10A and unfavorable influences on the organic insulating layer 24.

Now, results of prototyping liquid crystal display devices by using TFT substrates 100A which were actually produced by the above-described production method, and studying their reliability under high temperature and high humidity, will be described.

Example 1

A TFT substrate was produced by using the above-described production method, and a liquid crystal display device of Example 1 was produced by using this TFT substrate. The silicon nitride film had a thickness of 300 nm. The film formation conditions in the step of forming the silicon nitride film were as follows.

power density: 0.36 $W/cm^2$
intra-chamber pressure: 1400 mTorr
substrate temperature: 200° C.
ratio of gas flow rates: $SiH_4:NH_3:N_2=1:4:20$
inter-electrode distance: 20 mm

Example 2

Except that the power density was 0.41 $W/cm^2$, a liquid crystal display device of Example 2 was produced in a similar manner to the liquid crystal display device of Example 1.

Example 3

Except that the power density was 0.45 $W/cm^2$, a liquid crystal display device of Example 3 was produced in a similar manner to the liquid crystal display device of Example 1.

Example 4

Except that the power density was 0.49 $W/cm^2$, a liquid crystal display device of Example 4 was produced in a similar manner to the liquid crystal display device of Example 1.

Comparative Example 1

Except that the power density was 0.28 $W/cm^2$, a liquid crystal display device of Comparative Example 1 was produced in a similar manner to the liquid crystal display device of Example 1.

Comparative Example 2

Except that the power density was 0.32 $W/cm^2$, a liquid crystal display device of Comparative Example 2 was produced in a similar manner to the liquid crystal display device of Example 1.

By using a thermo-hygrostat (FX420N manufactured by Kusumoto Chemicals, Ltd.), the liquid crystal display devices of Examples 1 to 4 and Comparative Examples 1 and 2 were preserved for 300 hours in an environment of 70° C.·95% RH, after which presence or absence of air voids was checked via visual inspection and with an optical microscope. As a result, air voids had occurred in the liquid crystal display devices of Comparative Examples 1 and 2, but air voids had not occurred in Examples 1 to 4.

Figure 5:
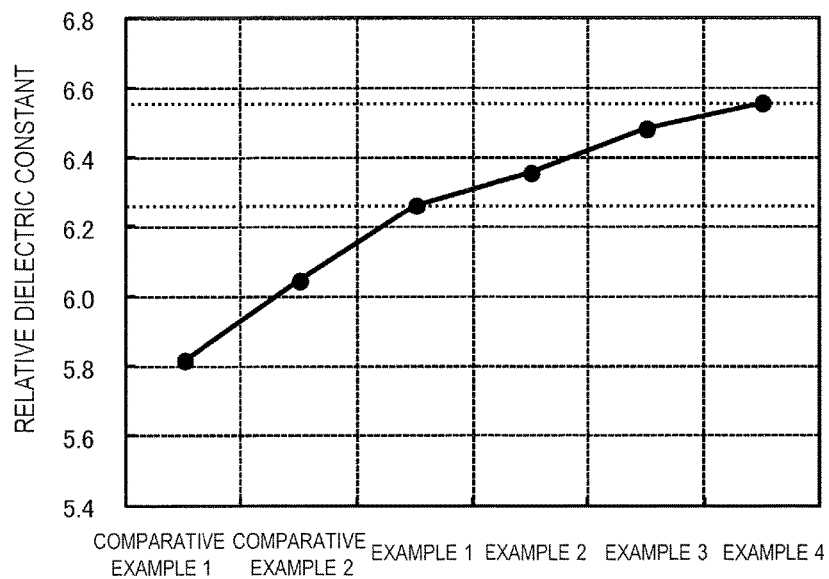
FIG. 5 Graphs showing a result of calculating a relative dielectric constant of a silicon nitride film for each of Examples 1 to 4 and Comparative Examples 1 and 2.

Next, each liquid crystal display device was disassembled, and by using a capacitance meter (4284A manufactured by Hewlett Packard Company), the capacitance of the dielectric layer (silicon nitride film) of each TFT substrate was measured, and a relative dielectric constant was calculated (measurement frequency: 1 kHz). FIG. 5 shows a result of calculating a relative dielectric constant of the silicon nitride film for each of Examples 1 to 4 and Comparative Examples 1 and 2.

As can be seen from FIG. 5, the silicon nitride films of Examples 1 to 4 had relative dielectric constants of, respectively, 6.25, 6.35, 6.48 and 6.56. On the other hand, the silicon nitride films of Comparative Examples 1 and 2 had relative dielectric constants of, respectively, 5.82 and 6.05. Thus, it was confirmed that silicon nitride films with a high relative dielectric constant, i.e., being dense in texture, had been formed in Examples 1 to 4 as compared to Comparative Examples 1 and 2.

Figure 6:
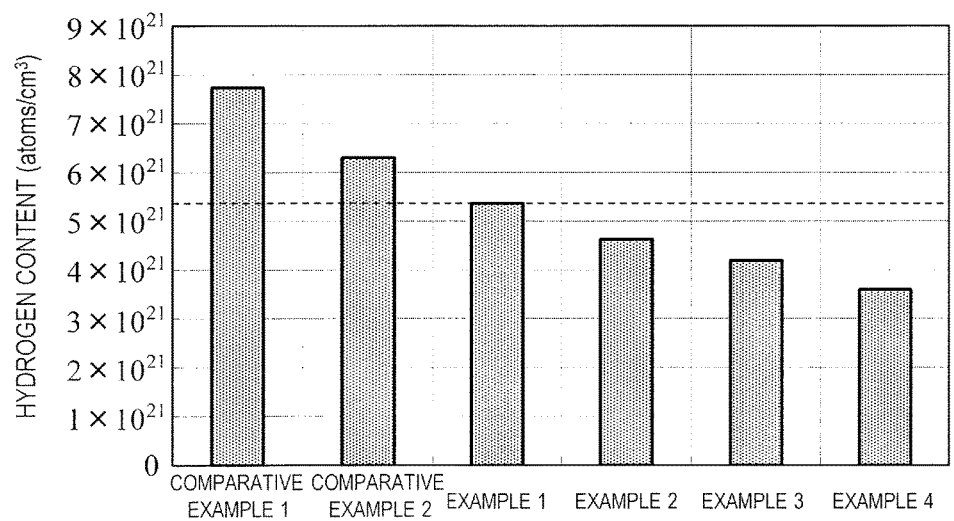
FIG. 6 Graphs showing results of hydrogen content calculation for each of Examples 1 to 4 and Comparative Examples 1 and 2.

Moreover, by using a thermal desorption spectroscopy (TDS) technique, an amount of desorbed hydrogen was measured for the dielectric layer (silicon nitride film) of each TFT substrate, and the hydrogen content in the silicon nitride film was calculated from the resultant amount of desorbed hydrogen. TDS1200 manufactured by ESCO, Ltd. was used for the measurement of the amount of desorbed hydrogen. Heating of each sample was performed with a degree of vacuum of $1 \times 10^{-7}$ Pa, while elevating the temperature from 80° C. to 700° C. at a rate of temperature elevation of 1° C./sec. FIG. 6 shows respective results of hydrogen content calculation for Examples 1 to 4 and Comparative Examples 1 and 2.

As can be seen from FIG. 6, the hydrogen contents in Comparative Examples 1 and 2 were $7.73 \times 10^{21}$ $atoms/cm^3$ and $6.30 \times 10^{21}$ $atoms/cm^3$ respectively, whereas the hydrogen contents in Examples 1 to 4 were $5.33 \times 10^{21}$ $atoms/cm^3$, $4.63 \times 10^{21}$ $atoms/cm^3$, $4.20 \times 10^{21}$ $atoms/cm^3$, and $3.60 \times 10^{21}$ $atoms/cm^3$, respectively. In other words, in Examples 1 to 4, the hydrogen content in the silicon nitride film was smaller than in Comparative Examples 1 and 2, each being $5.33 \times 10^{21}$ $atoms/cm^3$ or less.

As can be seen from the above study results, by setting the hydrogen content in the silicon nitride film, as the dielectric layer 34 composing a storage capacitor, to $5.33 \times 10^{21}$ $atoms/cm^3$ or less, air void formation in the liquid crystal layer can be suppressed, and the reliability of the liquid crystal display device under high temperature and high humidity can be improved.

Although the above description illustrates that the hydrogen content in the silicon nitride film is reduced by increasing the power density among the parameters of film formation conditions, the hydrogen content in the silicon nitride film can also be reduced by decreasing a ratio of the flow rate of SiH$_4$ to the total flow rate of the gaseous mixture. However, from the standpoint of maintaining film thickness uniformity within the substrate plane, it is more preferable to rely on power density adjustment in controlling the hydrogen content in the silicon nitride film.

Figure 7:
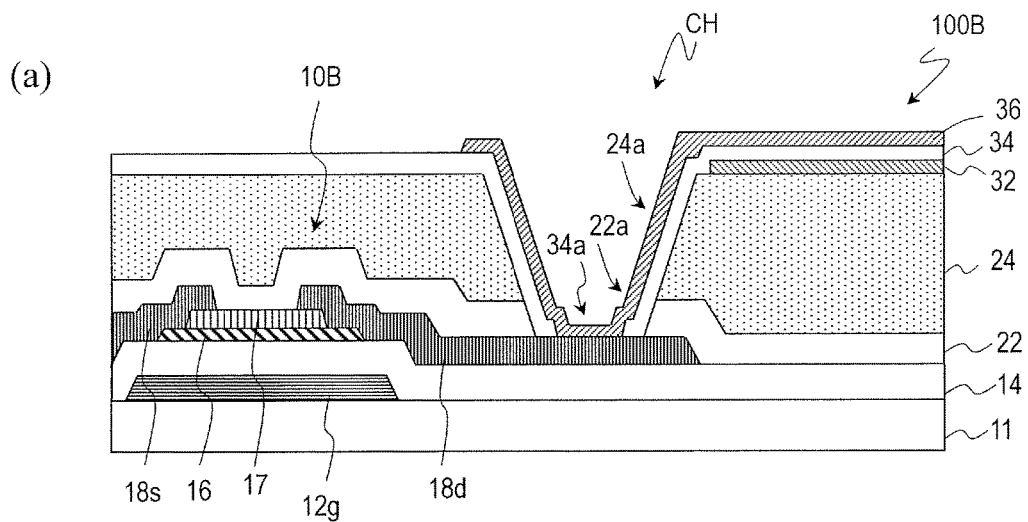
FIGS. 7 (a) and (b) are a schematic cross-sectional view and a plan view, respectively, of another TFT substrate 100B according to an embodiment of the present invention.
Figure 7:
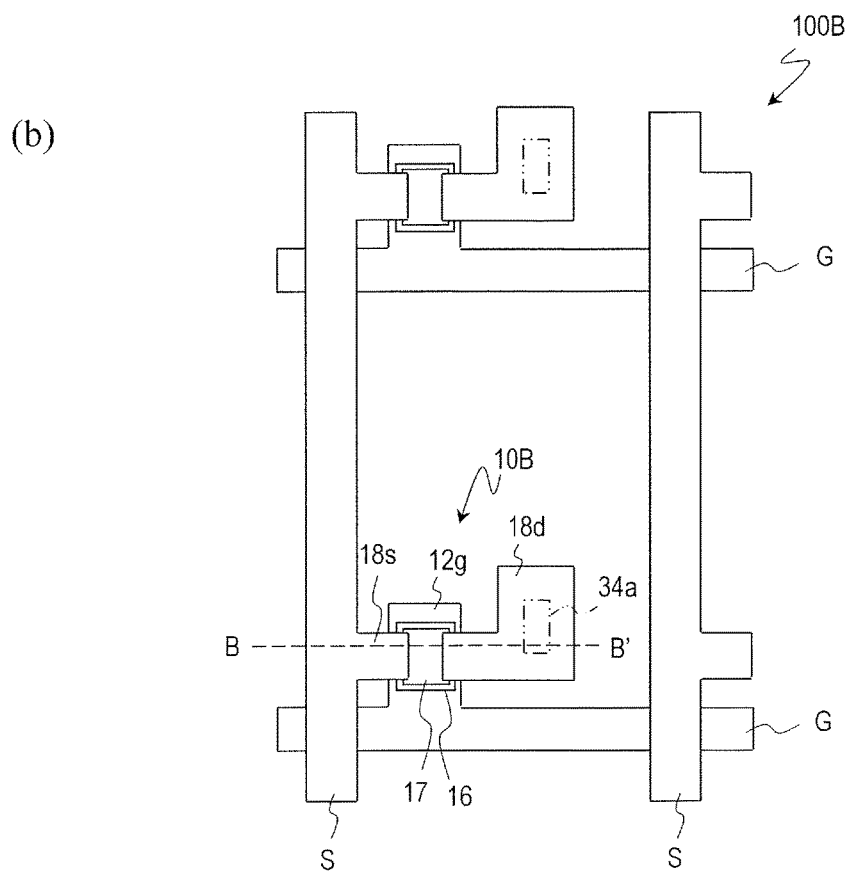

Next, a variant of the TFT substrate 100A according to an embodiment of the present invention will be described. FIGS. 7(a) and (b) show another TFT substrate 100B according to an embodiment of the present invention. FIGS. 7(a) and (b) are a schematic cross-sectional view and a plan view of the TFT substrate 100B, respectively, where FIG. 7(a) corresponds to a cross section along line A-A' in FIG. 7(b) (i.e., a cross section containing a TFT 10B). In FIG. 7(b), some of the constituent elements shown in FIG. 7(a) (e.g., an upper layer electrode 36 to be described later, etc.) are omitted.

As shown in FIGS. 7(a) and (b), in the TFT substrate 100B, the TFT 10B includes an etchstop layer 17 covering the channel region of the oxide semiconductor layer 16. By providing the etchstop layer 17, process damage occurring in the oxide semiconductor layer 16 can be reduced. Moreover, when the etchstop layer 17 includes an oxide film such as a silicon oxide film, it becomes possible to restore oxygen defects with the oxygen that is contained in the oxide film if such oxygen defects occur in the oxide semiconductor; thus, oxygen defects in the oxide semiconductor can be reduced.

The etchstop layer 17 can be formed by, after the oxide semiconductor layer 16 is formed and before the source electrode 18s and the drain electrode 18d are formed, using e.g. a CVD technique to deposit a protection film on the oxide semiconductor layer 16 and using a photolithography process to pattern this protection film. The patterning is to be performed so that at least the region of the oxide semiconductor layer 16 to become the channel region is covered by the etchstop layer 17. Herein, an SiO$_2$ film having a thickness of 150 nm is used as the etchstop layer 17. As the etchstop layer 17, a silicon oxide film, a silicon nitride film, a silicon oxynitride film, or a multilayer film of these may be used.

Although the above description illustrates an example where the lower layer electrode 32 and the upper layer electrode 36 function as a common electrode and a pixel electrode, respectively, this is not a limitation; a construction may be adopted where the lower layer electrode 32 and the upper layer electrode 36 respectively function as a pixel electrode and a common electrode. Although the above description illustrates the FFS mode as an example display mode, various other display modes may also be adopted. For example, a semiconductor device according to an embodiment of the present invention may be a TFT substrate for a liquid crystal display device of a VA (Vertical Alignment) mode or a TN (Twisted Nematic) mode. In this case, by allowing the upper layer electrode 36 to function as a pixel electrode, and allowing the lower layer electrode 32, which opposes the upper layer electrode 36 via the dielectric layer 34, to function as a storage capacitor electrode, a transparent storage capacitor can be created in the pixel with the upper layer electrode 36, the dielectric layer 34, and the lower layer electrode 32.

INDUSTRIAL APPLICABILITY

According to an embodiment of the present invention, the reliability of a semiconductor device including oxide semiconductor TFTs under high temperature and high humidity can be improved. A semiconductor device according to an embodiment of the present invention can be suitably used as a TFT substrate for a liquid crystal display device, for example.

REFERENCE SIGNS LIST 10A, 10B thin film transistor (TFT)
11 substrate
12g gate electrode
14 gate insulating film
16 oxide semiconductor layer
17 etchstop layer
18s source electrode
18d drain electrode
22 protection layer
24 organic insulating layer
32 lower layer electrode
34 dielectric layer
36 upper layer electrode
100A, 100B TFT substrate
G scanning line (gate bus line)
S signal line (source bus line)

The invention claimed is:

1. A production method of a semiconductor device comprising:
   step (a) of providing a substrate;
   step (b) of forming a thin film transistor on the substrate, the thin film transistor including an oxide semiconductor layer;
   step (c) of forming an organic insulating layer covering the thin film transistor;
   step (d) of forming a lower layer electrode on the organic insulating layer;
   step (e) of forming a dielectric layer on the lower layer electrode; and
   step (f) of forming an upper layer electrode on the dielectric layer, wherein
   step (e) is a step of forming a silicon nitride film as the dielectric layer, and is performed under film formation conditions such that the silicon nitride film has a hydrogen content of $5.33 \times 10^{21}$ atoms/cm$^3$ or less, and
   step (e) is performed by a plasma CVD technique, using a gaseous mixture containing SiH$_4$ and also containing NH$_3$ and/or N$_2$, under film formation conditions defined by: an intra-chamber pressure of not less than 1200 mTorr and not more than 1500 mTorr; a substrate temperature of not less than 180° C. and not more than 220° C.; an inter-electrode distance of not less than 18 mm and not more than 25 mm; a ratio of the flow rate of SiH$_4$ to a total flow rate of the gaseous mixture being not less than 3% and not more than 5%; and a power density of 0.36 W/cm$^2$ or more.

2. The production method of a semiconductor device of claim 1, wherein step (e) is performed with a power density of 0.49 W/cm$^2$ or less.

* * * * *